(12) United States Patent
Patlolla et al.

(10) Patent No.: US 10,714,382 B2
(45) Date of Patent: Jul. 14, 2020

(54) CONTROLLING PERFORMANCE AND RELIABILITY OF CONDUCTIVE REGIONS IN A METALLIZATION NETWORK

(71) Applicant: INTERNATIONAL BUSINESS MACHINES CORPORATION, Armonk, NY (US)

(72) Inventors: Raghuveer Patlolla, Guilderland, NY (US); Cornelius Brown Peethala, Slingerlands, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/157,286

(22) Filed: Oct. 11, 2018

(65) Prior Publication Data

US 2020/0118865 A1 Apr. 16, 2020

(51) Int. Cl.
*H01L 21/768* (2006.01)
*H01L 23/522* (2006.01)
*H01L 23/532* (2006.01)
*H01L 21/311* (2006.01)

(52) U.S. Cl.
CPC .... *H01L 21/7682* (2013.01); *H01L 21/31116* (2013.01); *H01L 21/76802* (2013.01); *H01L 21/76831* (2013.01); *H01L 21/76843* (2013.01); *H01L 21/76873* (2013.01); *H01L 21/76879* (2013.01); *H01L 23/5226* (2013.01); *H01L 23/5329* (2013.01)

(58) Field of Classification Search
CPC .......... H01L 21/7682; H01L 21/76843; H01L 21/76831; H01L 21/76879; H01L 21/76802
See application file for complete search history.

(56) References Cited

U.S. PATENT DOCUMENTS

| | | |
|---|---|---|
| 6,491,978 B1 | 12/2002 | Kalyanam |
| 6,518,167 B1 | 2/2003 | You et al. |
| 6,528,180 B1 | 3/2003 | Lee et al. |
| 6,680,538 B2 | 1/2004 | Kim et al. |
| 6,736,701 B1 | 5/2004 | Shue et al. |
| 6,774,489 B2 | 8/2004 | Russell et al. |
| 6,783,868 B2 | 8/2004 | Ciotti et al. |
| 6,910,947 B2 | 6/2005 | Paik |

(Continued)

OTHER PUBLICATIONS

A. Grill et al., "Progress in the development and understanding of advanced low k and ultralow k dielectrics for very large-scale integrated interconnects-State of the art", Applied Physics Reviews, 1, 011306, 2014, pp. 011306-1-011306-17.

(Continued)

*Primary Examiner* — Bac H Au
(74) *Attorney, Agent, or Firm* — Cantor Colburn LLP; Vazken Alexanian (57) ABSTRACT

Methods for forming conductive regions of a metallization network with reduced leakage current and capacitance are described. Aspects of the invention include forming a trench in a dielectric material on the substrate, forming a first liner layer in a first portion of the trench, forming a second liner layer in a second portion of the trench, and forming a conductive material over the second liner layer in the trench.

15 Claims, 7 Drawing Sheets

(56) References Cited

U.S. PATENT DOCUMENTS

| | | | |
|---|---|---|---|
| 6,913,938 | B2 | 7/2005 | Shanmugasundram et al. |
| 6,919,636 | B1 | 7/2005 | Ryan |
| 6,936,843 | B2 | 8/2005 | Cui |
| 6,950,716 | B2 | 9/2005 | Ward et al. |
| 6,952,052 | B1 | 10/2005 | Marathe et al. |
| 6,961,626 | B1 | 11/2005 | Paik |
| 6,984,198 | B2 | 1/2006 | Krishnamurthy et al. |
| 6,999,836 | B2 | 2/2006 | Schwarm et al. |
| 7,040,956 | B2 | 5/2006 | Paik |
| 7,069,101 | B1 | 6/2006 | Arackaparambil et al. |
| 7,082,345 | B2 | 7/2006 | Shanmugasundram et al. |
| 7,272,459 | B2 | 9/2007 | Kokotov et al. |
| 7,333,871 | B2 | 2/2008 | Scwarm |
| 7,337,019 | B2 | 2/2008 | Reiss et al. |
| 7,349,753 | B2 | 3/2008 | Paik |
| 7,354,332 | B2 | 4/2008 | Surana et al. |
| 9,040,411 | B2 | 5/2015 | Grill et al. |
| 9,312,224 | B1 | 4/2016 | Canaperi et al. |
| 9,385,028 | B2 | 7/2016 | Nemani et al. |
| 9,396,989 | B2 | 7/2016 | Purayath et al. |
| 9,721,833 | B2 | 8/2017 | Hebert |
| 9,754,822 | B1 * | 9/2017 | Chou .................. H01L 23/5283 |
| 9,934,963 | B2 | 4/2018 | Nguyen et al. |
| 2007/0224824 | A1 * | 9/2007 | Chen .................. H01L 21/3105 438/700 |
| 2008/0061442 | A1 * | 3/2008 | Ko ...................... H01L 21/3121 257/774 |
| 2009/0325381 | A1 * | 12/2009 | Chan .................. H01L 21/02164 438/675 |
| 2011/0204519 | A1 * | 8/2011 | Chikaki ............ H01L 21/02337 257/751 |
| 2012/0118619 | A1 * | 5/2012 | Booth, Jr. ......... H01L 21/31116 174/257 |
| 2013/0256903 | A1 * | 10/2013 | Shih .................. H01L 21/02167 257/774 |
| 2015/0091172 | A1 * | 4/2015 | Ko .................... H01L 23/53295 257/741 |
| 2016/0276280 | A1 | 9/2016 | Edelstein et al. |
| 2017/0278786 | A1 * | 9/2017 | Inoue .................. H01L 21/7682 |
| 2019/0067087 | A1 * | 2/2019 | Briggs ............. H01L 21/76831 |
| 2019/0067089 | A1 * | 2/2019 | Yang ................. H01L 21/76843 |

OTHER PUBLICATIONS

List of IBM Patents or Patent Applications Treated as Related; Date Filed: Dec. 3, 2019; 2 pages.

Patlolla et al., "Controlling Performance and Reliability of Conductive Regions in a Metallization Network," U.S. Appl. No. 16/699,934, filed Dec. 2, 2019.

* cited by examiner

CONTROLLING PERFORMANCE AND RELIABILITY OF CONDUCTIVE REGIONS IN A METALLIZATION NETWORK

BACKGROUND

The present invention generally relates to fabrication methods and resulting structures for semiconductor devices. More specifically, the present invention relates to methods and structure for controlling performance and reliability of conductive regions in a metallization network.

Semiconductor devices and components, which are referred to collectively herein as integrated circuit (IC) components, include a plurality of circuit elements (e.g., transistors, resistors, diodes, capacitors, etc.) communicatively connected together on a semiconductor substrate (i.e., a wafer or a chip). IC components are coupled to one another by a metallization network of interconnected layers and conductive regions formed in regions in the wafer/chip. The interconnect layers and conductive regions are often formed from copper (Cu), which facilitates the development of smaller metal components, reduces energy usage, and facilitates the fabrication of higher-performance processors.

SUMMARY

Embodiments of the present invention are directed to a method of forming conductive regions in a substrate. A non-limiting example of the method includes forming a trench in a dielectric material on the substrate, forming a first liner layer in a first portion of the trench, forming a second liner layer in a second portion of the trench, and forming a conductive material over the second liner layer in the trench.

Embodiments of the present invention are directed to a method of forming conductive regions in a substrate. A non-limiting example of the method includes forming a first trench and a second trench in a dielectric material on the substrate, forming a first liner layer in a first portion of the first trench and a second portion of the second trench, forming a second liner layer in a third portion of the first trench and a fourth portion of the second trench, forming a first conductive material over the second liner layer in the first trench, and forming a second conductive material over the second liner layer in the second trench.

Embodiments of the present invention are directed to a semiconductor structure. A non-limiting example of the semiconductor structure includes a first liner layer formed in a first portion of a first trench and a second portion of a second trench, each the first trench and second trench are formed in a dielectric material on a substrate, a second liner layer formed over a third portion of the first trench and a fourth portion of the second trench, a first conductive material formed over the second liner layer in the first trench, and a second conductive material formed over the second liner layer in the second trench.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1-5 depict a method for forming a metallization network according to embodiments of the invention, in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, semiconductor devices are used in a variety of electronic applications. An IC is typically formed from various circuit configurations of semiconductor devices (e.g., transistors, capacitors, resistors, etc.) and conductive interconnect layers (known as metallization layers) formed on semiconductor wafers. Alternatively, semiconductor devices can be formed as monolithic devices, e.g., discrete devices. Semiconductor devices and conductive interconnect layers are formed on semiconductor wafers by depositing many types of thin films of material over the semiconductor wafers, patterning the thin films, doping selective regions of the semiconductor wafers, etc.

In contemporary semiconductor fabrication processes, a large number of semiconductor devices and a conductive metallization network are fabricated in and on a single wafer. The conductive metallization network serve as a network of pathways that transport signals throughout an IC, thereby connecting circuit components of the IC into a functioning whole and to the outside world. The metallization network includes interconnect layers that vary in number and type depending on the complexity of the device. The interconnect layers are themselves interconnected by a network of conductive coupling regions formed on or in the wafer(s) of the IC. For example, in some IC architectures, the conductive coupling regions are, in effect, electrical contacts that extend into a dielectric layer formed on the semiconductor wafer or die. As IC feature sizes continue to decrease, the aspect ratio, (i.e., the ratio of height/depth to width) of features such as conductive coupling regions generally increases. Fabricating intricate structures of conductive interconnect layers and conductive coupling regions within an increasingly smaller IC footprint is one of the most process-intensive and cost-sensitive portions of semiconductor IC fabrication.

Interconnect layers and conductive coupling regions formed in regions in the wafer/chip are often formed from copper, which facilitates the development of smaller metal components, reduces energy usage, and facilitates the fabrication of higher-performance processors. The fabrication operations used to form copper conductive coupling regions can include forming a trench in a dielectric layer over the substrate, over-filling the trench with copper fill material, and planarizing the over-fill (or overburden) using, for example, a chemical mechanical planarization (CMP) process. In some implementations, the conductive coupling region is formed by depositing in the trench a seed layer of copper or a copper manganese alloy prior to over-filling the trench with the copper fill material. In some implementations, the conductive coupling region is formed by depositing a traditional liner material layer in the trench prior to depositing the seed layer and/or the copper fill material.

However, as the size of ICs decreases, conductive coupling regions are positioned more closely to one another, which can result in unwanted or parasitic capacitance and increased resistance in the conductive coupling regions. Additionally, reliability and electro-migration (EM) performance are negatively impacted as barrier thickness is downscaled in metallic interconnects (e.g., conductive coupling regions). In addition to risks associated with barrier continuity on sidewalls, degradation of the dielectric layers can negatively impact device performance. For example, bulk porous ultra-low k (ULK) are utilized as a dielectric material containing these metallic interconnect structures. The trenches formed in the ULK dielectric material to house the metallic interconnect structures are formed utilizing etching techniques such as plasma etching. The ULK dielectric can have a k value of less than about 3.0 or a k value of less than about 2.0. For example, the material that is used to form the ULK dielectric is typically a porous ULK dielectric such as octamethyl cyclotetra siloxane (OMCTS). A drawback of forming conductive coupling regions of a metallization network in a porous dielectric material is the damage sustained by the porous dielectric material as a result of various plasma exposure steps (e.g., forming trenches in the porous dielectric material using reactive ion etching (ME) and stripping). This damage is characterized by a so-called carbon depletion region, which is defined by a gradient in carbon concentration through the porous dielectric material. For example, the carbon depletion region can begin in area of reduced carbon concentration that was exposed to the plasma process (i.e., near the exposition to the plasma process), and extends through the dielectric material where the carbon concentration continuously increases. This carbon depletion region for various ULK dielectric materials has an adverse effect on the integrity of the dielectric materials, thereby increasing leakage current and capacitance. In essence, the carbon depletion region mimics properties of an oxide material rather than dielectric material.

Turning now to an overview of aspects of the invention, one or more embodiments of the invention address the above-described shortcomings of the prior art by providing fabrication methods and resulting structures to form conductive coupling regions in porous ULK dielectric layers by incorporating a dielectric liner between the porous ULK dielectric layer and the conductive fill material during the fabrication process. The dielectric liner can also serve as a protective barrier when forming air gaps between multiple conductive coupling regions. The dielectric liner can be removed after the formation of these airgaps leaving the interconnect structures having air gaps between each other, thus, decreasing the dielectric constant.

Figure 1:
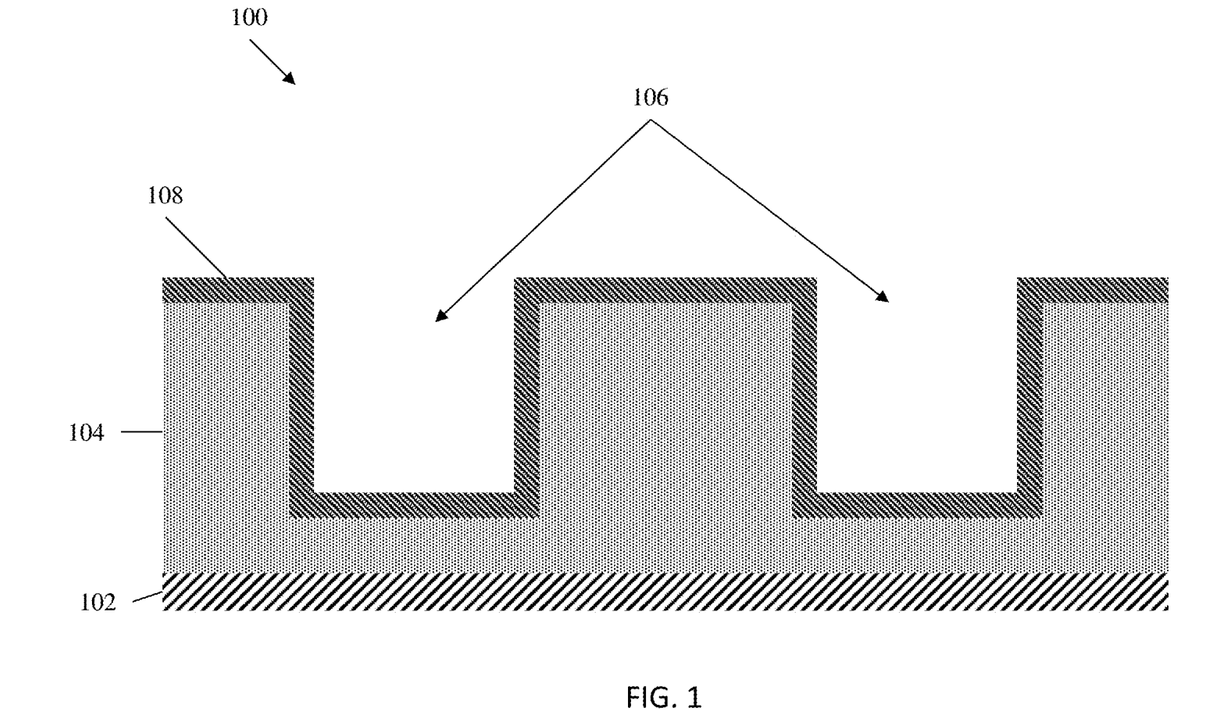
FIG. 1 depicts a cross-sectional view of a portion of a metallization network of a semiconductor substrate after initial fabrication operations according to one or more embodiments of the invention.

Turning now to a more detailed description of aspects of the present invention, FIGS. 1-5 depict a process for forming a metallization network 100 according to embodiments of the invention. More specifically, FIG. 1 depicts a cross-section view of a portion of the metallization network 100 after known fabrication operations have been used to bring the metallization network 100 to a fabrication stage wherein the metallization network 100 includes a substrate 102, a dielectric insulation layer 104, trenches 106 formed in the dielectric insulation layer 104, and a liner layer 108 conformally deposited over the dielectric insulation layer 104 and along the sidewalls and bottom of the trenches 106. The number of trenches 106 depicted in FIG. 1 are for ease of illustration and description. In embodiments of the invention, any number and/or combination of trenches 106 can be used.

The substrate 102 can be any type of semiconductor material including but not limited to silicon. The dielectric insulating layer 104 can include a bulk porous ULK material including but not limited to octamethylcyclotetrasiloxane (OMCTS), SiCOH. In one or more embodiments of the invention, the trenches 106 are formed in the dielectric insulation layer 104 using plasma etching processes including but not limited to reactive ion etching (ME). In one or more embodiments of the invention, the liner layer 108 can be a dielectric, metal nitride, or metal oxide liner that is non-porous as compared to the dielectric insulation layer 104. The liner layer 108 can be silicon nitride (SiN), silicon oxy nitride (SiON), SiOCN, AlN, AlOx, manganese nitride (MnN), or combination of these materials. The liner layer 108 can be deposited using any type of deposition process including but not limited to PVD, CVD, and ALD.

Figure 2:
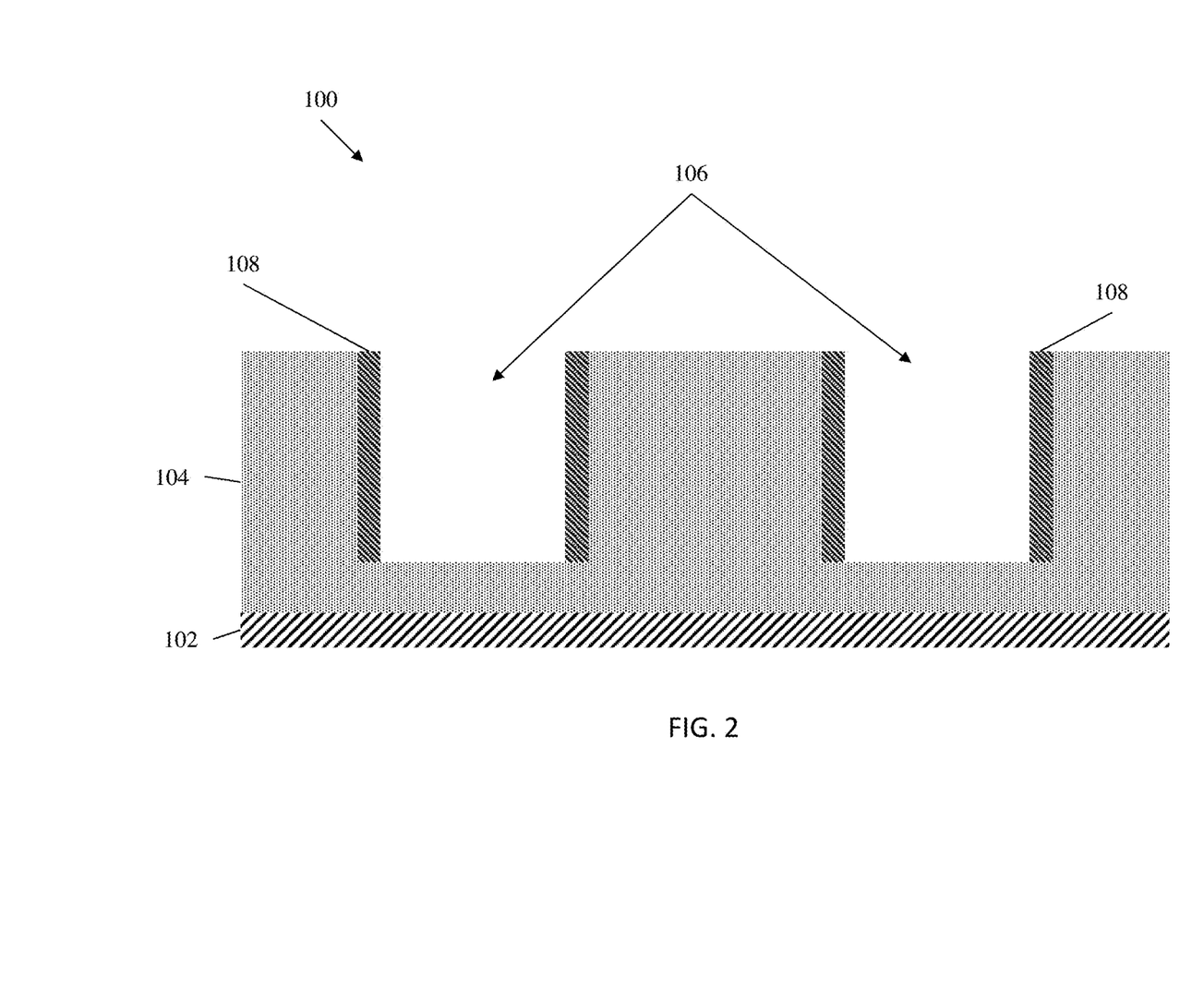
FIG. 2 depicts a cross-sectional view of the metallization network of the semiconductor substrate after fabrication operations according to one or more embodiments of the invention.

FIG. 2 depicts a cross-section view of the metallization network 100 after known semiconductor fabrication operations have been used to remove portion of the liner layer 108 according to one or more embodiments of the invention. The known fabrication operations include a directional plasma etch of the liner layer selective to the dielectric insulation layer 104 to expose portions of the insulation layer 104 at the bottom of the trench 106 while maintaining the liner layer 104 on the sidewalls of the trench 106. The liner layer 104 over the top portions of the dielectric insulation layer 104 can be removed utilizing a chemical-mechanical planarization (CMP) process.

Figure 3:
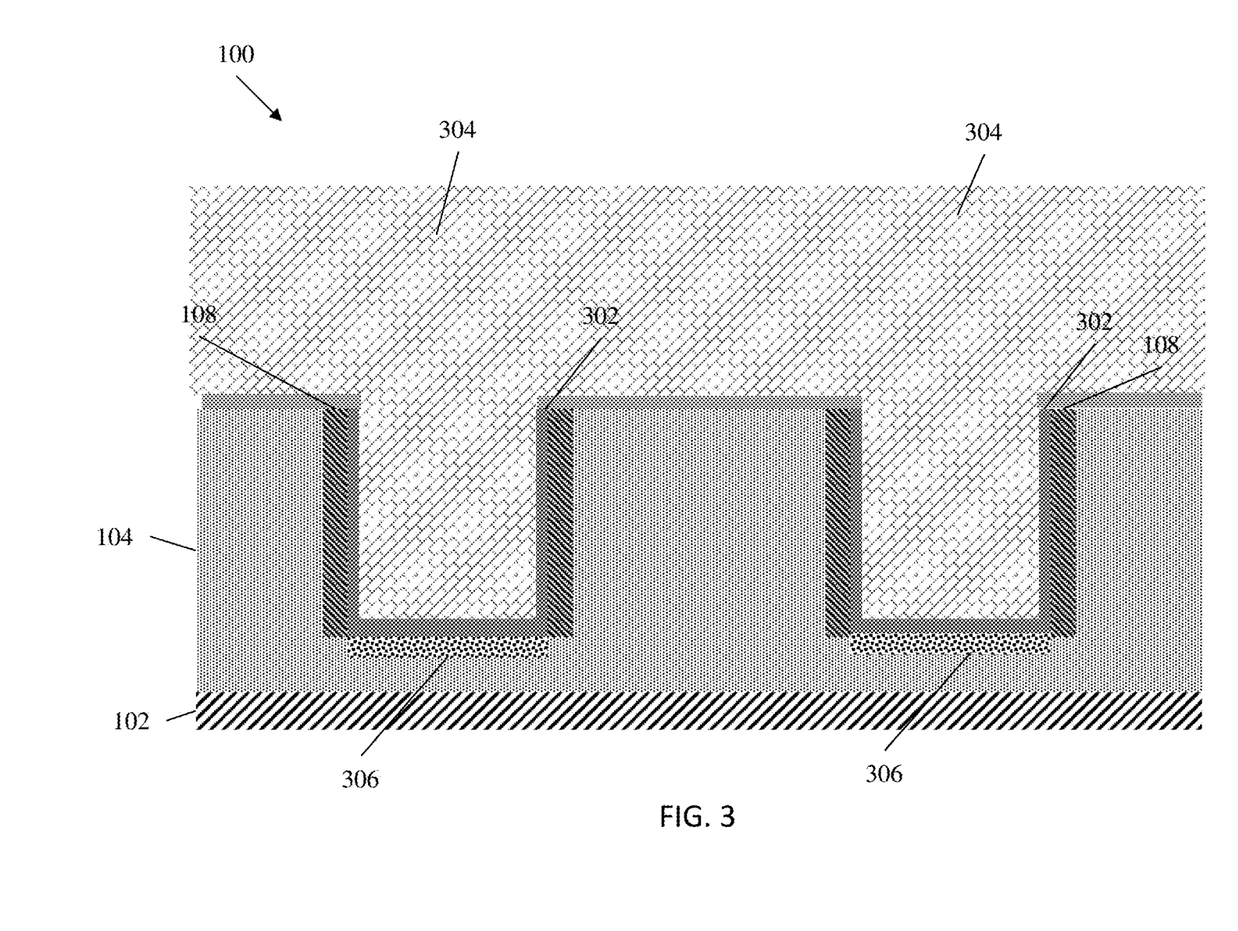
FIG. 3 depicts a cross-sectional view of the metallization network of the semiconductor substrate after fabrication operations according to one or more embodiments of the invention.
Figure 4:
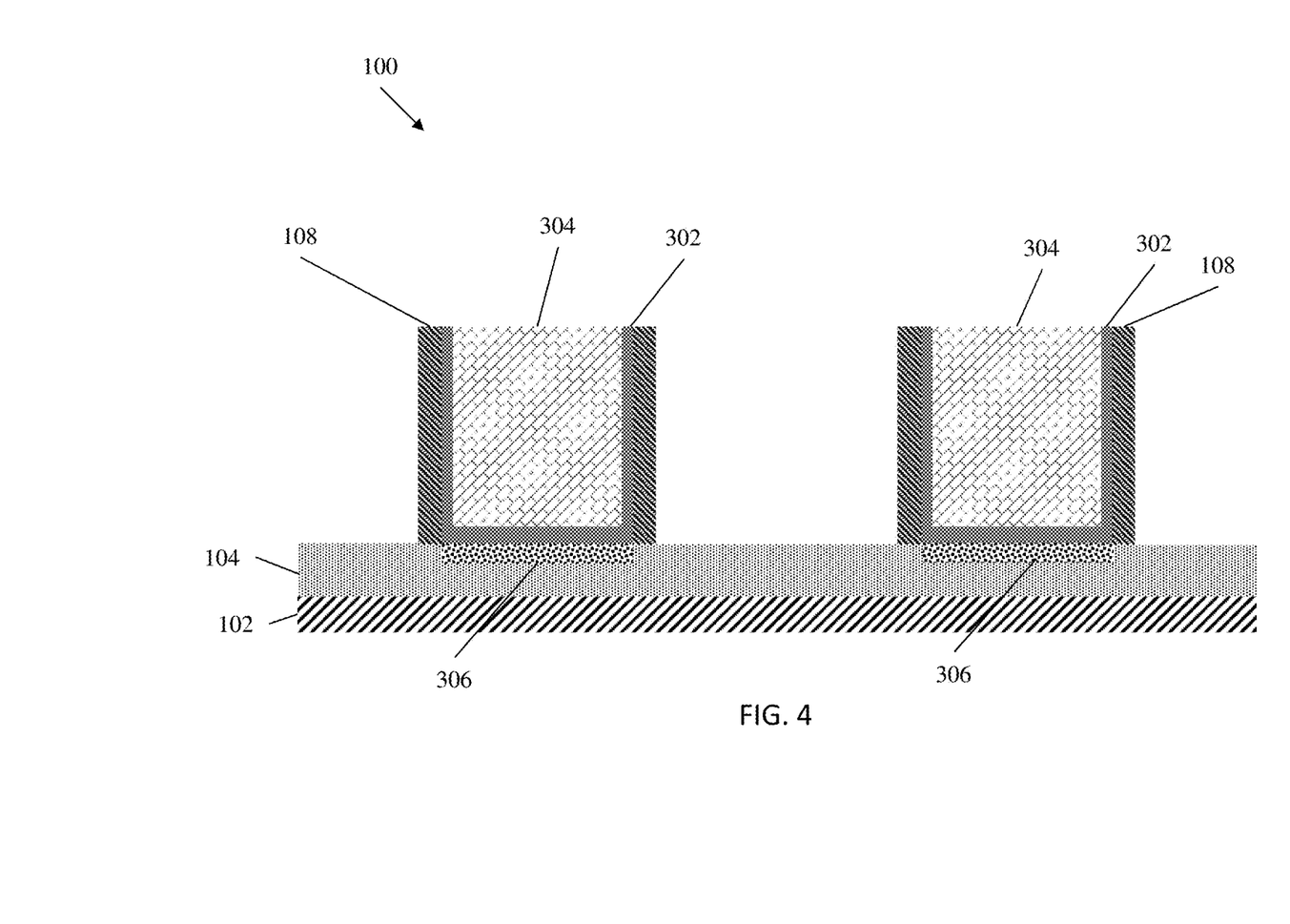
FIG. 4 depicts a cross-sectional view of the metallization network of the semiconductor substrate after fabrication operations according to one or more embodiments of the invention.

FIG. 3 depicts a cross-section view of the metallization network 100 after known semiconductor fabrication operations have been used to form a second liner layer (or seed layer) 302 and deposit a conductive fill material 304 in the trenches 106 (shown in FIG. 1) of the dielectric insulation layer 104 according to one or more embodiments of the invention. In embodiments of the invention, the known fabrication operations include conformally depositing the second liner layer 302 on the dielectric insulation layer 104 and along the liner layer 108 on the sidewalls of the trenches 106. The second liner layer 302 (for example Ti, TiN, Ta, TaN, Co, Ru, and CuMn) can be deposited using any type of deposition process including but not limited to PVD, CVD, and ALD. The conductive fill material 304 (for example, Cu, Co, Ru, Ir, Rh, and W) is deposited on the second liner layer 302 and fills the remaining volume of the trenches 106 (shown in FIG. 2). The conductive fill material 304 can be deposited using any suitable means. For example, in some embodiments of the invention the conductive fill material can be deposited by over-filling the trenches 106 with the conductive fill material 304. In some embodiments of the invention the conductive fill material can be deposited by electroplating, PVD, CVD, or combination for example. The second liner layer 302 can be a variety of materials including, for example, copper, cobalt, ruthenium, copper manganese alloy, or similarly functioning materials. The second liner 302 can function as seed layer when the conductive material 304 is deposited by electroplating. In general, a seed layer provides a layer of continuous, low resistance, electrical conductivity during the metal electroplating. Seed layers can be deposited using sputtering, evaporation methods, chemical vapor deposition, or any other suitable deposition method. For example, a physical vapor deposition (PVD) process can be employed to form the seed layer 302.

In embodiments of the invention, the second liner layer 302 can be a traditional liner such as, for example, tantalum, titanium, cobalt, ruthenium, and any of their nitrides and alloys. The conductive fill material 304 can be any type of conductive material including, but not limited to, copper, aluminum, tungsten, cobalt, ruthenium, and iridium.

In one or more embodiments of the invention, the resultant metallization network 100 in FIG. 3 can be utilized in an integrated circuit (IC) having reduced leakage current and capacitance due to the incorporation of the low-k dielectric liner layer 108. The low-k dielectric liner layer 108 can have a k value of less than about 3.9. In embodiments of the invention, the liner layer 108 can be any dielectric layer material. The carbon depletion regions formed in the dielectric insulation layer 104 from the etching process forming the trenches 106 now have the dielectric liner layer 108 between the conductive material and the carbon depletion regions in the dielectric insulation layer 104. As described above, the carbon depletion regions exhibit properties similar to that of an oxide material which results in capacitance leakage. In addition, the liner layers 108 arranged between the conductive material trenches provide additional protections from capacitance leakage due to the low-k properties of the liner layers 108. In addition, a copper barrier 306 is formed during a post conductive fill anneal operation. The anneal operation can be a thermal anneal at a temperature between 100 C and 350 C. The copper barrier 306 is formed by a reaction of the alloy metal in copper with oxygen and silicon in the dielectric. This copper barrier has the following properties: the copper barrier prevents Cu diffusion into the dielectric. Because it is formed in the dielectric by alloy reaction, it reduces trench resistance through an increase in cross sectional area for conductor and partial removal of the alloy element from conductor. A thermal anneal process can be conducted between 100 C and 350 C for 10 minutes to 1 hour in N2 environment. While only two conductive regions are shown in the illustrations, multiple conductive regions can be formed using the above described process.

In some embodiments of the invention, additional fabrication operations are applied to the metallization network 100 shown in FIG. 3. For example, in FIG. 4, known semiconductor fabrication operations have been used for planarizing the overburden and remove portions of the dielectric material. The overburden can be planarized utilizing, for example, a CMP process. In addition, the planarizing operation removes portions of the second liner layer 302. In embodiments of the invention, the known fabrication operations include a plasma or wet etch to remove portions of the dielectric insulating layer 104. The respective liner layers 108 protect the second liner layers 302 and conductive materials 304 during the etching process. The etching process reduces leakage current and capacitance by reducing/eliminating the diffusion barrier in the dielectric insulation material 104. The portions of the dielectric insulating layer 104 can be removed utilizing a wet etch, a dry etch, or any combination of the two. For example, a plasma treatment combined with a wet etch can remove the portions of the dielectric 104. The plasma can contain chlorine, fluorine, or carbon tetrafluoride. The wet etch can include hydrofluoric acid, hydrochloric acid, or sulfuric acid mixed with hydrogen peroxide.

Figure 5:
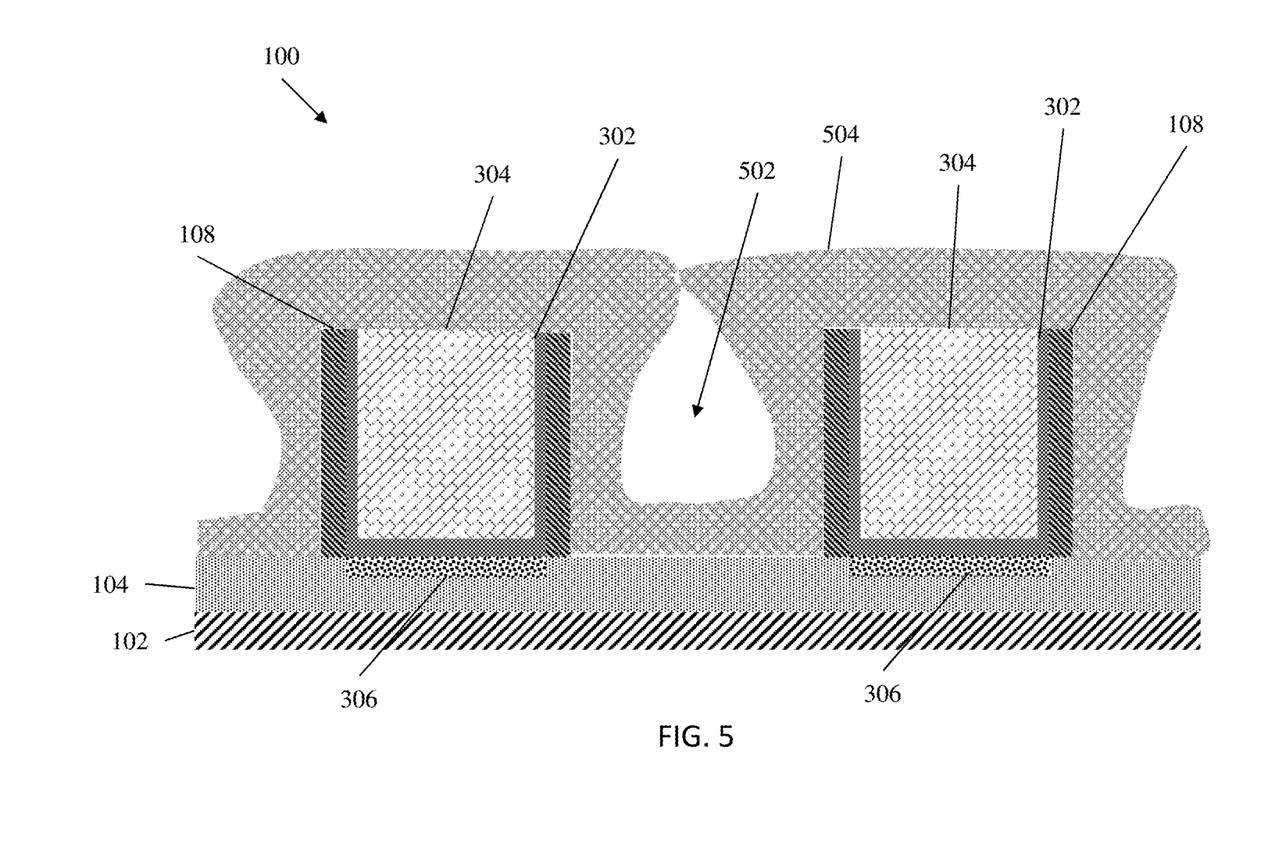
FIG. 5 depicts a cross-sectional view of the metallization network of the semiconductor substrate after fabrication operations according to one or more embodiments of the invention

In FIG. 5, known semiconductor fabrication operations have been used to form air gaps between the resultant conductive material structures according to one or more embodiments of the invention. Conformal deposition of a dielectric cap 504 results in pinch off and formation of an airgap 502 therein. As such, the resulting structure provides airgaps within a deposited dielectric cap 503 between conductive material structures 304. The airgap 502 further reduces capacitance issues between the two conductive material structures.

Figure 6:
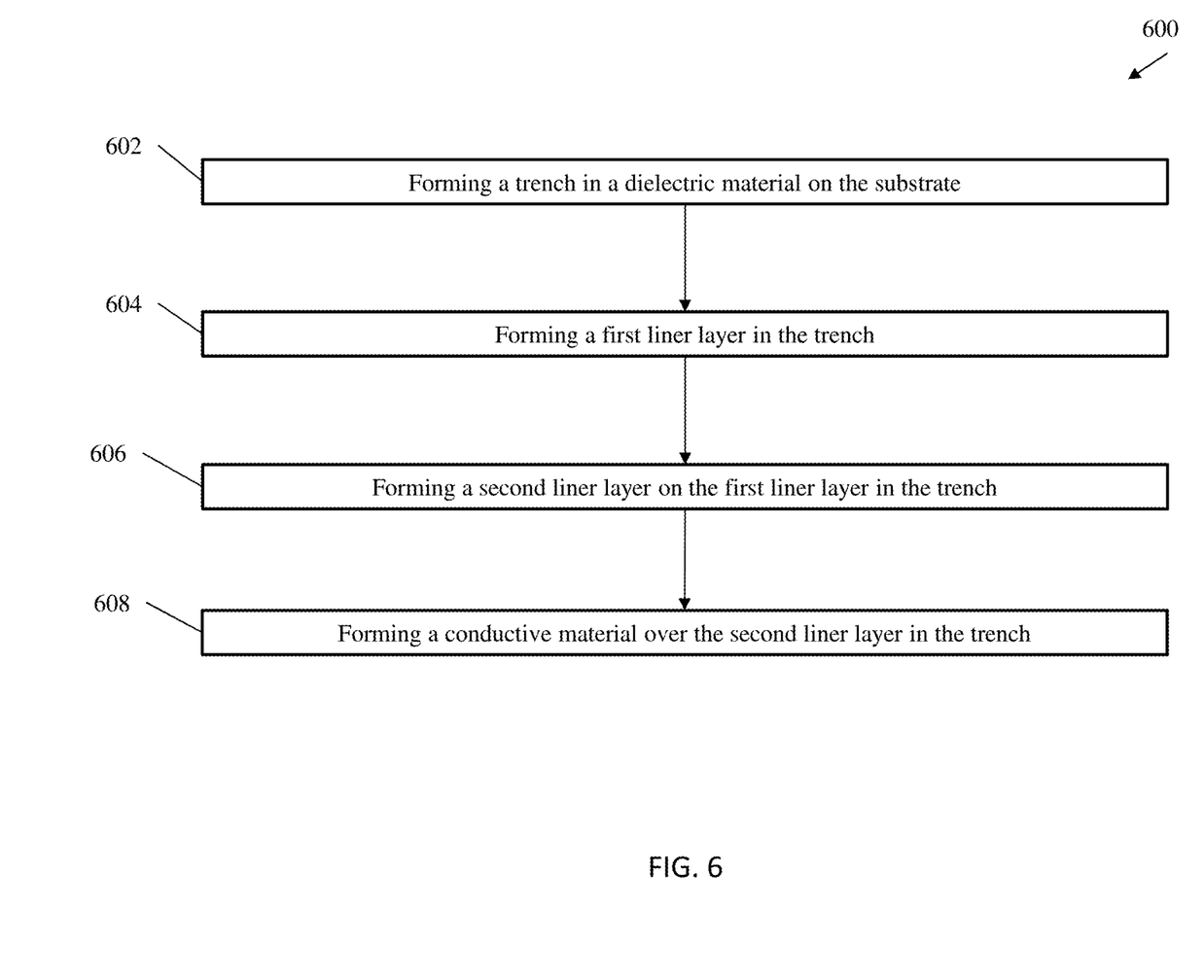
FIG. 6 depicts a flow diagram of a method according to one or more embodiments of the invention.

FIG. 6 depicts a flow diagram illustrating a method 600 for forming a conductive region 304 of a metallization network associate with a dielectric insulation region 104 on a substrate 102 according to one or more embodiments of the invention. The method 600 includes forming a trench in a dielectric material on the substrate, as shown in block 602. The dielectric material can be a bulk porous ultra-low k dielectric material. During etching of the trench in the dielectric material, carbon depletion regions can be formed near the sidewalls and bottom of the trench as a result of the etching process. To account for these carbon depletion regions, the method 600 includes forming a first liner layer in the trench, as shown at block 604. In embodiments of the invention, the first liner layer can be a dielectric material such as, for example, silicon nitride. The conductive trench is formed by the method 600 including forming a second liner layer on the first liner layer in the trench, as shown in block 606. And at block 608, the method 600 includes forming a conductive material over the second liner layer in the trench. Additional processes can also be included. It should be understood that the processes depicted in FIG. 6 represent illustrations and that other processes can be added or existing processes can be removed, modified, or rearranged without departing from the scope and spirit of the present invention.

Figure 7:
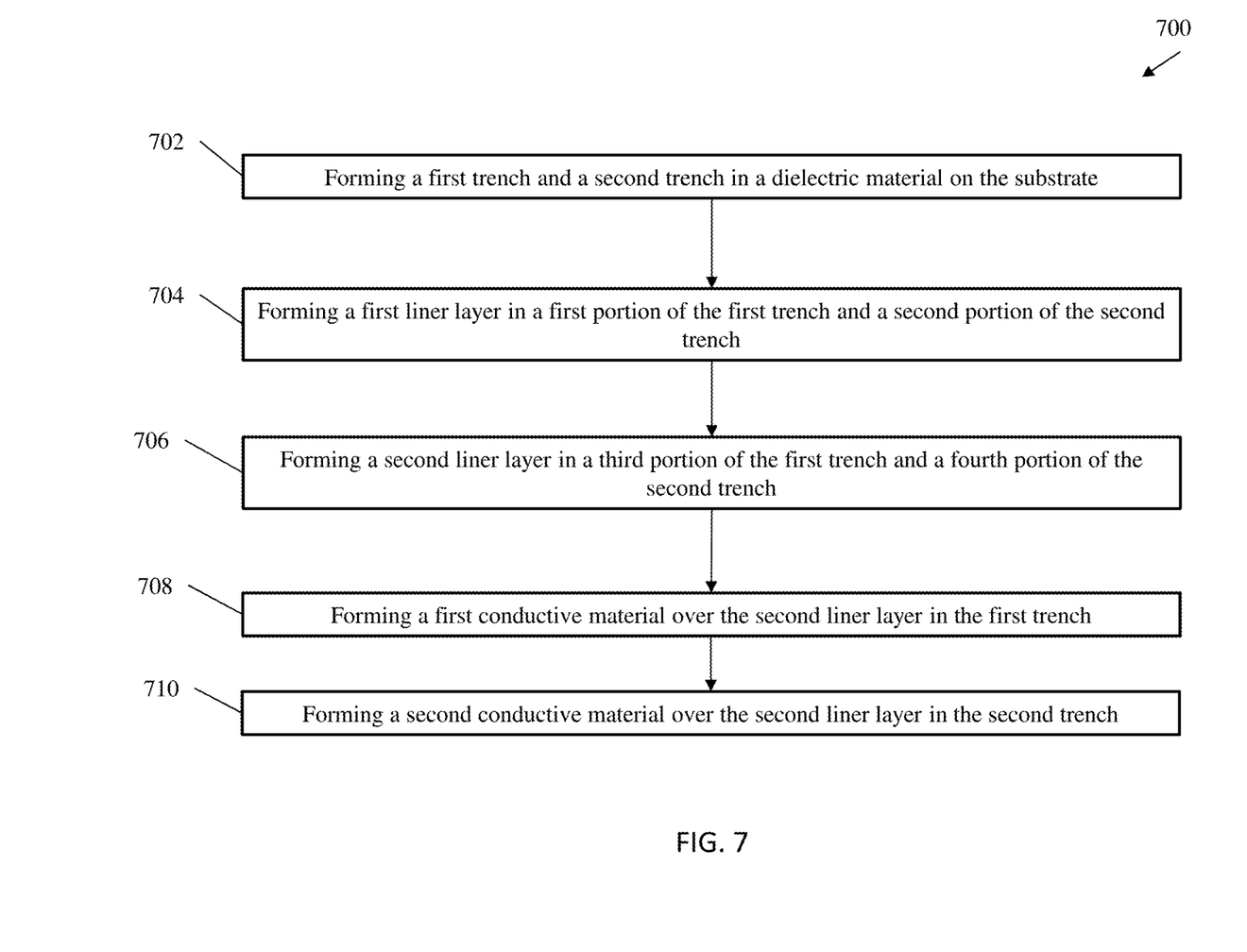
FIG. 7 depicts a flow diagram of a method according to one or more embodiments of the invention.

FIG. 7 depicts a flow diagram of a method 700 for forming conductive regions 304 of a metallization network associate with a dielectric insulation region 104 on a substrate 102 according to one or more embodiments of the invention. The method 700 includes forming a first trench and a second trench in a dielectric material on the substrate 702. At block 704, the method 700 includes forming a first liner layer in a first portion of the first trench and a second portion of the second trench. The first and second trench are separated by the dielectric insulation region 104. The method 700, at block 706, includes forming a second liner layer in a third portion of the first trench and a fourth portion of the second trench. And at block 708, the method 700 includes forming a first conductive material over the second liner layer in the first trench. The method 700, at block 710, includes forming a second conductive material over the second liner layer in the second trench.

Additional processes can also be included. It should be understood that the processes depicted in FIG. 7 represent illustrations and that other processes can be added or existing processes can be removed, modified, or rearranged without departing from the scope and spirit of the present invention.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a conductive coupling region of a metallization network associated with a substrate, the method comprising:
   forming a trench in a dielectric material on the substrate;
   forming a first liner layer in a first portion of the trench;
   forming a second liner layer in a second portion of the trench;
   forming a conductive material over the second liner layer in the trench;
   forming the first liner layer such that the first liner layer is not present over a bottom surface of the trench; and
   forming the second liner layer such that at least a portion of the second liner is over the bottom surface of the trench, wherein the bottom surface of the trench is defined by a portion of the dielectric material; and
   performing an anneal to form a copper barrier at the bottom surface of the trench, the copper barrier comprising an alloy material in the second liner layer, oxygen, and silicon in the dielectric material on the substrate.

2. The method of claim 1, wherein the dielectric material on the substrate comprises a porous low-k dielectric material.

3. The method of claim 2, wherein the porous low-k dielectric material comprises octamethylcyclotetrasiloxane (OMCTS).

4. The method of claim 1, wherein the trench is formed by a plasma etching process that forms a carbon depleted region in the dielectric material on the substrate.

5. The method of claim 4, wherein the carbon depleted region in the dielectric material on the substrate is adjacent to sidewalls of the trench.

6. The method of claim 1, wherein the first liner layer comprises a dielectric material.

7. The method of claim 6, wherein the dielectric material comprises silicon nitride, SiCN, SiOCN, SiON, or SiBCN.

8. The method of claim 1, wherein the first liner layer comprises a metal oxide, the metal oxide comprising $Al_2O_3$.

9. The method of claim 1, wherein the first liner layer comprises a metal nitride, the metal nitride comprising AlN or MnN.

10. The method of claim 1, wherein the second liner layer comprises a seed layer, the seed layer comprising a cobalt and copper manganese.

11. A method of forming conductive regions of a metallization network associated with a substrate, the method comprising:
    forming a first trench and a second trench in a dielectric material on the substrate;
    forming a first liner layer in a first portion of the first trench and a second portion of the second trench;
    forming a second liner layer in a third portion of the first trench and a fourth portion of the second trench;
    forming a first conductive material over the second liner layer in the first trench;
    forming a second conductive material over the second liner layer in the second trench; and
    forming the first liner layer such that the first liner layer is not present over a first bottom surface of the first trench and is not present over a second bottom surface of the second trench; and
    forming the second liner layer such that at least a portion of the second liner layer is over the first bottom surface of the first trench and the second bottom surface of the second trench, wherein the first bottom surface of the first trench and the second bottom surface of the second trench are defined by a portion of the dielectric material; and
    performing an anneal to form a copper barrier at the first bottom surface of the first trench and the second bottom surface of the second trench, the copper barrier comprising an alloy material in the second liner layer, oxygen, and silicon in the dielectric material on the substrate.

12. The method of claim 11 further comprising removing a portion of the dielectric material on the substrate between a first portion of the first liner layer disposed on a first sidewall of the first trench and a second portion of the first liner layer disposed on a second sidewall of the second trench, wherein removing the portion of the dielectric material exposes the first portion of the first liner layer and the second portion of the first liner layer.

13. The method of claim 11 further comprising:
    removing a portion of the dielectric between the first conductive material and the second conductive material; and
    conformally depositing a dielectric cap over a portion of the dielectric, a portion of the first liner layer, a portion of the second liner layer, a portion of the first conductive material, and a portion of the second conductive material to form an airgap between the first conductive material and the second conductive material.

14. The method of claim 11, wherein the dielectric material on the substrate comprises a porous low-k dielectric material.

15. The method of claim 14, wherein the porous low-k dielectric material comprises octamethylcyclotetrasiloxane (OMCTS).

* * * * *